(12) United States Patent
Choi

(10) Patent No.: US 7,405,915 B2
(45) Date of Patent: Jul. 29, 2008

(54) PROTECTION CIRCUIT AGAINST ELECTROSTATIC DISCHARGE IN SEMICONDUCTOR DEVICE

(75) Inventor: Nak-Heon Choi, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 0 days.

(21) Appl. No.: 11/368,117

(22) Filed: Mar. 3, 2006

(65) Prior Publication Data

US 2007/0206339 A1    Sep. 6, 2007

(51) Int. Cl.
*H02H 3/22* (2006.01)
(52) U.S. Cl. .......................................... 361/56; 361/111
(58) Field of Classification Search ............. 361/56–58, 361/91.1, 111
See application file for complete search history.

(56) References Cited

U.S. PATENT DOCUMENTS

| | | | | |
|---|---|---|---|---|
| 5,978,192 A | * | 11/1999 | Young et al. ................... | 361/56 |
| 6,919,602 B2 | * | 7/2005 | Lin et al. ..................... | 257/360 |
| 6,965,503 B2 | * | 11/2005 | Connor et al. ................. | 361/56 |
| 6,989,979 B1 | | 1/2006 | Tong et al. | |
| 6,989,980 B2 | * | 1/2006 | Kitagawa .................... | 361/91.1 |
| 7,079,369 B2 | * | 7/2006 | Hulfachor et al. ........... | 361/111 |
| 2007/0091530 A1 | * | 4/2007 | Chen ........................... | 361/111 |

FOREIGN PATENT DOCUMENTS

KR    10-0189993    1/1999

* cited by examiner

*Primary Examiner*—Stephen W Jackson
*Assistant Examiner*—Danny Nguyen
(74) *Attorney, Agent, or Firm*—Blakely, Sokoloff, Taylor & Zafman LLP

(57) ABSTRACT

An electrostatic discharge protection circuit for use in a semiconductor device includes an electrostatic signal discharge unit for discharging an electrostatic signal; a first electrostatic detection voltage supplying unit for generating an electrostatic detection voltage in response to an alternating current component of the electrostatic signal; a driving unit for generating a driving voltage in response to the electrostatic detection voltage in order to drive the electrostatic signal discharge unit; and a second electrostatic detection voltage supplying unit enabled in response to the driving voltage for continuously supplying the electrostatic detection voltage to the driving unit in response to a direct current component of the electrostatic signal.

6 Claims, 3 Drawing Sheets

PROTECTION CIRCUIT AGAINST ELECTROSTATIC DISCHARGE IN SEMICONDUCTOR DEVICE

FIELD OF INVENTION

The present invention relates to a semiconductor device; and, more particularly, to a protection circuit against an electrostatic discharge.

DESCRIPTION OF PRIOR ART

Generally, an electrostatic discharge (ESD) is one factor of a downgrade of a reliability of a semiconductor device. The electrostatic discharge is generated when a user handles the semiconductor device or the semiconductor device is installed in a system, and the generated electrostatic discharge damages the semiconductor device.

Therefore, an electrostatic discharge protection circuit is included in a data input/output region of the semiconductor device in order to protect the semiconductor device from the electrostatic discharge.

Meanwhile, there are various models of the generation of the electrostatic discharge, i.e., a human body model (HBM), a machine model (MM) and a charge device model (CDM).

According to the human body model, if a semiconductor integrated chip (IC) is contacted to a human body charged with a static electricity, the charged static electricity is discharged to the inside of the semiconductor integrated chip through an external pin and an input/output pad of the semiconductor integrated chip. Therefore, due to the current wave of the static electricity having a large electric energy, an internal circuit of the semiconductor integrated chip can be seriously damaged. Likewise, in case of the machine model, the generation of the electrostatic discharge is caused by a machine charged with the static electricity.

In case of the charge device model, the internal circuit of the semiconductor device is charged with the static electricity and the electrostatic discharge is generated when the semiconductor device is contacted with the machine causing the serious damage of the semiconductor device.

Therefore, most semiconductor devices are provided with an electrostatic discharge protection circuit for protecting the semiconductor device from the above-mentioned damage. The electrostatic discharge protection circuit is generally included between the input/output pad and the internal circuit of the semiconductor device. In many cases, an input/output buffer also has the electrostatic discharge protection ability.

As a technology for manufacturing the semiconductor device is developed, a thickness of a gate insulating layer of a transistor included in the input/output buffer is more thinned. Accordingly, the internal circuit of the semiconductor device is more easily damaged by the electrostatic discharge.

That is, if the thickness of the gate insulating layer is thinned, a voltage level for destroying the gate insulating layer is lowered. Therefore, even though a voltage level of the electrostatic discharge is low, the internal circuit of the semiconductor device is damaged by the electrostatic discharge.

One of methods for overcoming the above-mentioned problem is coupling an n-type metal oxide semiconductor (NMOS) transistor with the input pad, wherein a gate of the NMOS transistor is connected to another transistor which is turned on when an electrostatic signal is generated.

FIG. 1 is a schematic circuit diagram showing a conventional electrostatic discharge protection circuit.

As shown, the conventional electrostatic discharge protection circuit includes an NMOS transistor 101, a PMOS transistor 102, a resistor 103 and a capacitor 104.

By employing the resistor 103 and the capacitor 104, when a high frequency of an electrostatic signal is generated, an alternating current due to the electrostatic signal is flown through the capacitor 104. While this current is flown through the resistor 103, a voltage dropping occurs and, thus, a gate voltage of the PMOS transistor 102 becomes lower than a source voltage VCC.

Accordingly, the PMOS transistor 102 is operated and, thus, a gate voltage of the NMOS transistor 101 is increased. As a result, an electrostatic current is flown through the NMOS transistor 101. Therefore, the conventional electrostatic discharge protection circuit is more rapidly operated than a timing of a junction breakdown of the conventional electrostatic discharge protection circuit.

However, while the voltage dropping due to the alternating current is fast, a duration time is short. That is, an operation time for handling the electrostatic signal is short.

Since the voltage dropping due to the alternating current occurs only during a rising period of the electrostatic signal, the operation of the NMOS transistor 101 is limited within the rising period of the electrostatic signal. After the rising period of the electrostatic signal, the protection operation relies on only a parasitic bipolar transistor of the NMOS transistor 101.

Therefore, for effectively protecting an internal circuit of a semiconductor device at a peak point or during a falling period of the electrostatic signal, an operational duration time of the NMOS transistor 101 is required to be extended for increasing a current driving ability of the NMOS transistor 101 during the peak point and the falling period of the electrostatic signal.

For this purpose, an improved conventional electrostatic discharge protection circuit provided with a delay circuit has been developed as shown in FIG. 2 (U.S. Pat. No. 5,946,177 for reference).

FIG. 2 is a schematic circuit diagram depicting the improved conventional electrostatic discharge protection circuit.

As shown, a voltage decreasing time of a gate voltage of the NMOS transistor 101 is delayed by an operation of the delay circuit 201 having a capacitor 202 and a resistor 203. Accordingly, the NMOS transistor 101 can be operated for a longer time.

However, in this case, the capacitor 202 and the resistor 203 should have an RC constant which is close to a duration time of the electrostatic signal (about 100 ns). Since an RC constant of the resistor 103 and the capacitor 104 for triggering the detection of the electrostatic signal is less than 10 ns, the RC constant of the capacitor 202 and the resistor 203 is about 10 times larger than that of the resistor 103 and the capacitor 104. Accordingly, a size of a chip is increased.

SUMMARY OF INVENTION

It is, therefore, an object of the present invention to provide an electrostatic discharge protection circuit for stably passing an electrostatic current without increasing a size of an additional circuit of a semiconductor device.

In accordance with an aspect of the present invention, there is provided an electrostatic discharge protection circuit for use in a semiconductor device, including: an electrostatic signal discharge unit for discharging an electrostatic signal; a first electrostatic detection voltage supplying unit for generating an electrostatic detection voltage in response to an alternating current component of the electrostatic signal; a driving unit for generating a driving voltage in response to the electrostatic detection voltage in order to drive the electrostatic signal discharge unit; and a second electrostatic detection voltage supplying unit enabled in response to the driving voltage for continuously supplying the electrostatic detection voltage to the driving unit in response to a direct current component of the electrostatic signal.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, an electrostatic discharge protection circuit in accordance with the present invention will be described in detail referring to the accompanying drawings.

Figure 1:
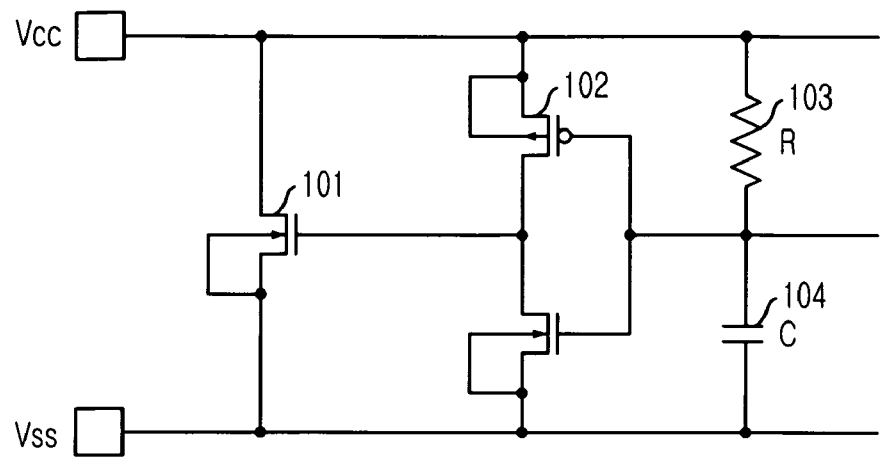
FIG. 1 is a schematic circuit diagram showing a conventional electrostatic discharge protection circuit.
Figure 2:
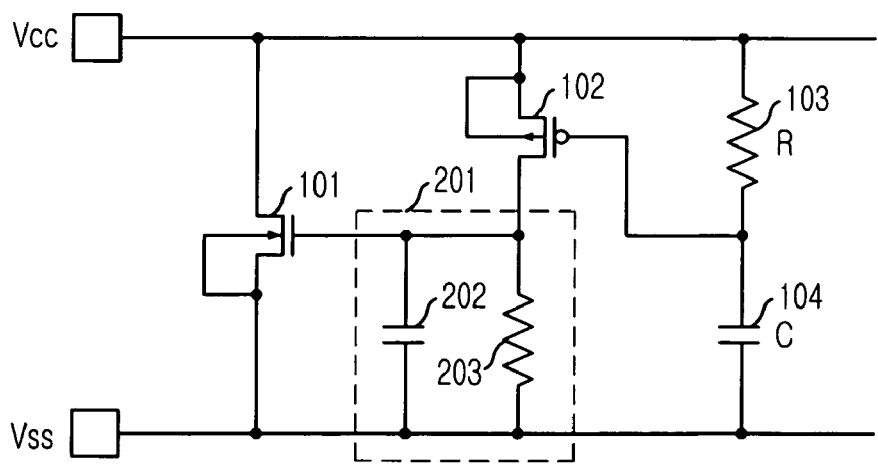
FIG. 2 is a schematic circuit diagram depicting an improved conventional electrostatic discharge protection circuit.
Figure 3:
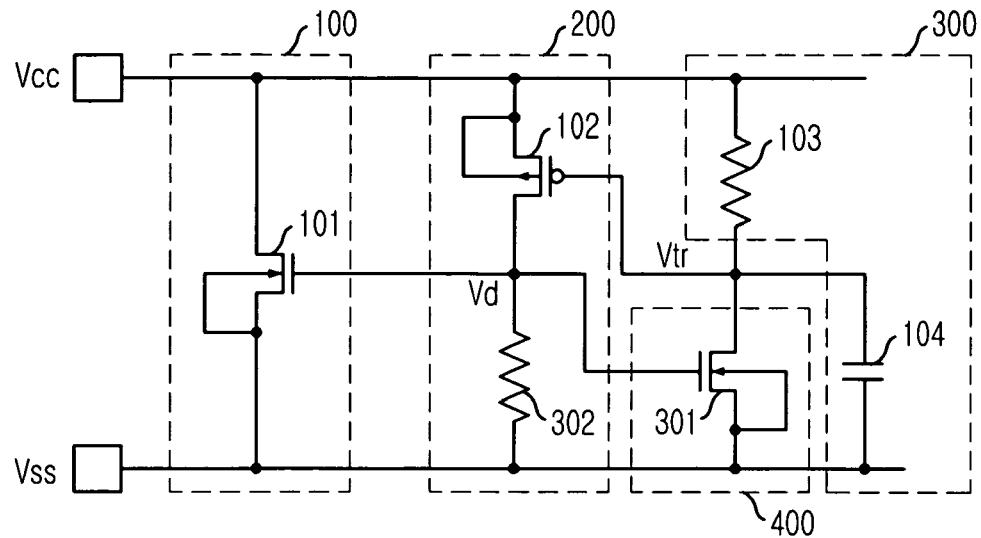
FIG. 3 is a schematic circuit diagram showing an electrostatic discharge protection circuit for use in a semiconductor device in accordance with a first embodiment of the present invention.

FIG. 3 is a schematic circuit diagram showing an electrostatic discharge protection circuit for use in a semiconductor device in accordance with a first embodiment of the present invention.

As shown, the electrostatic discharge protection circuit includes an electrostatic signal discharge unit 100, a first electrostatic detection voltage supplying unit 300, a driving unit 200 and a second electrostatic detection voltage supplying unit 400.

The electrostatic signal discharge unit 100 serves to discharge an electrostatic signal. The first electrostatic detection voltage supplying unit 300 generates an electrostatic detection voltage Vtr in response to an alternating current component of the electrostatic signal.

The driving unit 200 generates a driving voltage Vd for driving the electrostatic signal discharge unit 100 in response to the electrostatic detection voltage Vtr. The second electrostatic detection voltage supplying unit 400 is enabled in response to the driving voltage Vd and controls the electrostatic detection voltage Vtr to be continuously supplied to the driving unit 200 in response to a direct current component of the electrostatic signal.

In detail, the electrostatic signal discharge 100 includes a first n-type metal oxide semiconductor (NMOS) transistor 101 connected between a power supply voltage VCC and a ground voltage VSS.

The driving unit 200 includes a p-type metal oxide semiconductor (PMOS) transistor 102 and a driving resistor 302. One terminal of the PMOS transistor 102 is coupled to the power supply voltage VCC and the other terminal is coupled to a gate of the first NMOS transistor 101. A gate of the PMOS transistor 102 receives the electrostatic detection voltage Vtr. The driving resistor 302 is connected between the other terminal of the PMOS transistor 102 and the ground voltage VSS.

The first electrostatic detection voltage supplying unit 300 includes an electrostatic detection resistor 103 whose one terminal is coupled to the power supply voltage VCC; and a capacitor 104 connected between the other terminal of the electrostatic detection resistor 103 and the ground voltage VSS.

The second electrostatic detection voltage supplying unit 400 includes a second NMOS transistor 301 whose gate is coupled to a node commonly coupled by the PMOS transistor 102 and the driving resistor 302. One terminal of the second NMOS transistor 301 is coupled to a node commonly coupled by the electrostatic detection resistor 103 and the capacitor 104 and the other terminal of the second NMOS transistor 301 is coupled to the ground voltage VSS.

Referring to FIG. 3, an operation of the electrostatic discharge protection circuit is described below.

When the electrostatic signal is generated and is inputted to the power supply voltage VCC with a reference of the ground voltage VSS, an alternating current is flown through the capacitor 104 at a rising period of the electrostatic signal and, thus, a voltage dropping of the electrostatic detection resistor 103 is generated due to the electrostatic current. Therefore, a voltage supplied to a gate of the PMOS transistor 102 is become lower than a voltage supplied to a source, i.e., the power supply voltage VCC, by the electrostatic signal and, thus, the PMOS transistor 102 is turned on.

Accordingly, the voltage inputted to the power supply voltage VCC by the electrostatic signal is transferred to a gate of the first NMOS transistor 101 and, thus, the first NMOS transistor 101 is turned on. Therefore, a current due to the electrostatic signal is discharged to the ground voltage VSS through the first NMOS transistor 101.

Herein, the first NMOS transistor 101 is designed to have an enough size for passing several amperes (A) of the current due to the electrostatic signal.

Meanwhile, for maintaining the discharging operation of the electrostatic signal from the generation timing to the end timing of the electrostatic signal, the second NMOS transistor 301 is turned on and is operated together with the first NMOS transistor 101 because a gate of the second NMOS transistor 301 is coupled to a gate of the first NMOS transistor 101.

Until a falling period of the electrostatic signal after a predetermined time is passed from the rising period of the electrostatic signal, the first electrostatic detection voltage supplying unit 300 cannot maintain the voltage dropping across the electrostatic detection resistor 103 because there is no alternating current component due to the electrostatic signal. However, due to the above-mentioned operation of the second NMOS transistor 301, the voltage dropping can be maintained by a direct current which flows through the second NMOS transistor 301.

Accordingly, until the falling period of the electrostatic signal after the predetermined time is passed from the rising period of the electrostatic signal, the current due to the electrostatic signal can be discharged by the first NMOS transistor 101.

As a result, since the current due to the electrostatic signal can be discharged during the whole duration of the electrostatic signal, an internal circuit of the semiconductor device can be more stably protected.

Figure 4:
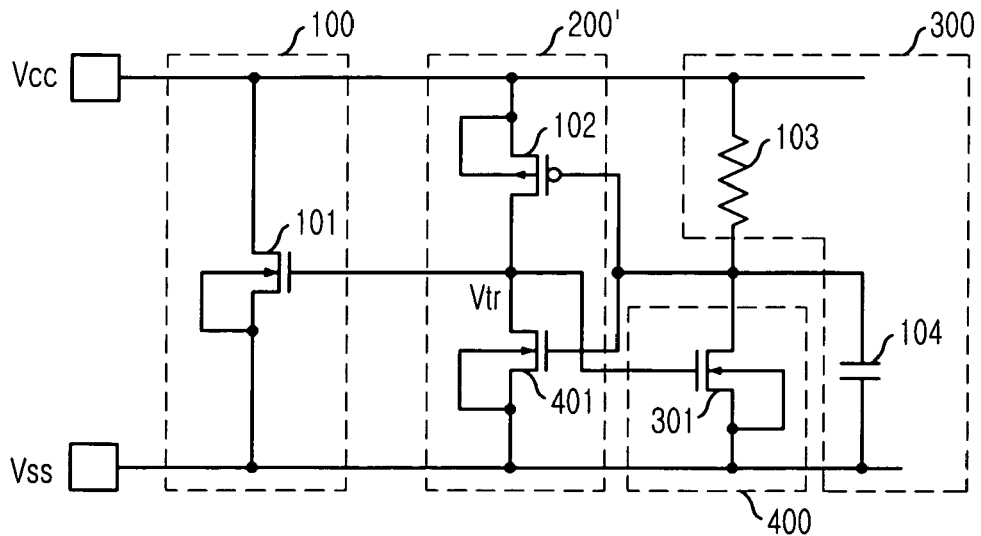
FIG. 4 is a schematic circuit diagram depicting an electrostatic discharge protection circuit in accordance with a second embodiment of the present invention.

FIG. 4 is a schematic circuit diagram depicting an electrostatic discharge protection circuit in accordance with a second embodiment of the present invention.

In comparison with the electrostatic discharge protection circuit shown in FIG. 3, the driving resistor 302 is replaced with an NMOS transistor.

A driving unit 200' of the electrostatic discharge protection circuit includes a PMOS transistor 102 and a driving NMOS transistor 401.

One terminal of the PMOS transistor 102 is coupled to a power supply voltage VCC and the other terminal of the PMOS transistor 102 is coupled to a gate of a first NMOS transistor 101. A gate of the PMOS transistor 102 receives an electrostatic detection voltage Vtr.

One terminal and the other terminal of the driving NMOS transistor 401 are respectively coupled to the other terminal of the PMOS transistor 102 and a ground voltage VSS. A gate of the driving NMOS transistor 401 is commonly coupled to the gate of the PMOS transistor 102.

Since an operation of the electrostatic discharge protection circuit is very similar to the electrostatic discharge protection circuit shown in FIG. 3 except that the driving NMOS transistor 401 replaces the driving resistor 302, a detailed description of the operation of the electrostatic discharge protection circuit is omitted.

However, in accordance with the second embodiment of the present invention, the driving NMOS transistor 401 is not operated when the PMOS transistor 102 is operated. Therefore, the electrostatic detection voltage Vtr supplied to each gate of the first NMOS transistor 101 and a second NMOS transistor 301 can be increased more rapidly.

Figure 5:
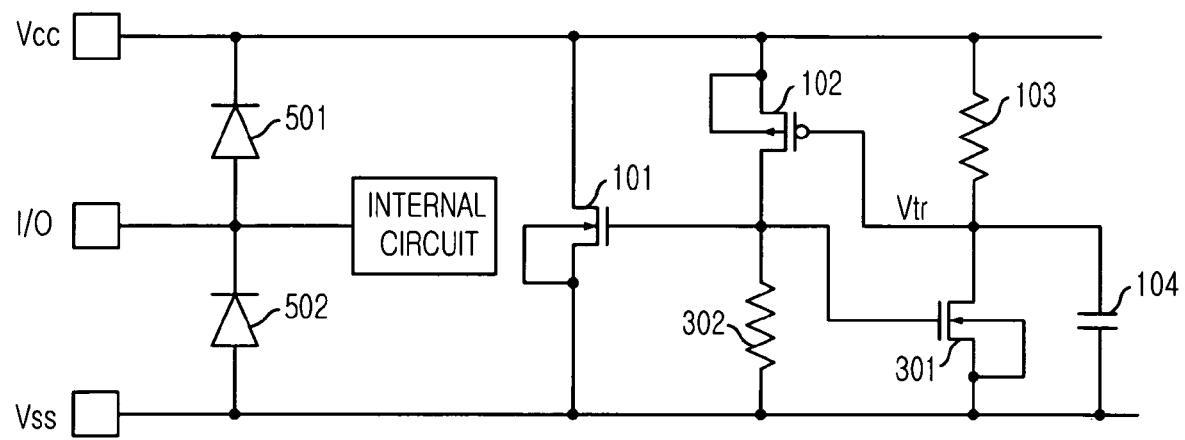
FIG. 5 is a schematic circuit diagram showing the electrostatic discharge protection circuit shown in FIG. 3 is applied to a semiconductor device which includes an input/output pin.

FIG. 5 is a schematic circuit diagram showing the electrostatic discharge protection circuit shown in FIG. 3 is applied to a semiconductor device which includes an input/output pin.

As shown, when the electrostatic signal is inputted to an input/output pad (I/O), a first and a second diodes 501 and 502 are included in order to bypass the electrostatic signal to a power line, i.e., the power supply voltage VCC or the ground voltage VSS. The electrostatic discharge protection circuit is connected between the power supply voltage VCC and the ground voltage VSS.

The first diode 501 serves to transfer a high voltage electrostatic signal inputted through the input/output pad to the power supply voltage VCC. Similarly, the second diode 502 serves to transfer a low voltage electrostatic signal inputted through the input/output pad to the ground voltage VSS.

If a semiconductor device is constructed as shown in FIG. 5, even though the electrostatic signal is inputted through the input/output pad, the electrostatic signal is bypassed to the power line by the diode and the bypassed electrostatic signal is discharged by the electrostatic discharge protection circuit. Therefore, the internal circuit of the semiconductor device can be stably protected.

As a result, in accordance with the present invention, the electrostatic discharge protection circuit can more stably protect a semiconductor device from the electrostatic discharge having a reduced size in comparison with the prior art. Particularly, since the electrostatic discharge protection circuit is stably operated during the whole duration of the electrostatic signal, the internal circuit can be stably protected even at the latter period of the electrostatic signal. Therefore, a semiconductor device which includes a highly integrated internal circuit can be effectively protected from the electrostatic discharge.

While the present invention has been described with respect to the particular embodiments, it will be apparent to those skilled in the art that various changes and modifications may be made without departing from the spirit and scope of the invention as defined in the following claims.

What is claimed is:

1. An electrostatic discharge protection circuit for use in a semiconductor device, comprising:
   an electrostatic signal discharge unit for discharging an electrostatic signal, the electrostatic signal discharge unit including a first NMOS transistor receiving an electrostatic detection voltage through its gate;
   a first electrostatic detection voltage supplying unit for generating the electrostatic detection voltage in response to an alternating current component of the electrostatic signal;
   a driving unit for generating a driving voltage in response to the electrostatic detection voltage in order to drive the electrostatic signal discharge unit; and
   a second electrostatic detection voltage supplying unit enabled in response to the driving voltage for continuously supplying the electrostatic detection voltage to the driving unit in response to a direct current component of the electrostatic signal, the second electrostatic detection voltage supplying unit including a second NMOS transistor;
   wherein the driving unit includes:
     a PMOS transistor whose one terminal and the other terminal are respectively coupled to the power supply voltage and gates of the first and the second NMOS transistors, wherein a gate of the PMOS transistor receives the electrostatic detection voltage; and
     a first resistor connected between the other terminal of the PMOS transistor and ground voltage, wherein a gate of the second NMOS transistor is directly coupled to a common node between the PMOS transistor and the first resistor of the driving unit, wherein the common node is coupled to the gate of the first NMOS transistor.

2. The electrostatic discharge protection circuit as recited in claim 1, wherein the first NMOS transistor is connected between a power supply voltage and a ground voltage.

3. The electrostatic discharge protection circuit as recited in claim 2, wherein the first electrostatic detection voltage supplying unit includes:
   a second resistor whose one terminal is coupled to the power supply voltage; and
   a capacitor connected between the other terminal of the second resistor and the ground voltage.

4. The electrostatic discharge protection circuit as recited in claim 3, wherein one terminal and other terminal of the second NMOS transistor are respectively coupled to a node commonly coupled by the second resistor and the capacitor and the ground voltage.

5. The electrostatic discharge protection circuit as recited in claim 4, wherein the capacitor is a parasitic capacitor which is parasitic at one terminal of the first NMOS transistor.

6. The electrostatic discharge protection circuit as recited in claim 1, further comprising:
   a data input/output pad;
   a first diode for transferring a high voltage electrostatic signal inputted through the input/output pad to the power supply voltage; and
   a second diode for transferring a low voltage electrostatic signal inputted through the input/output pad to the ground voltage.

* * * * *